United States Patent
Kim et al.

(10) Patent No.: US 7,872,351 B2
(45) Date of Patent: Jan. 18, 2011

(54) MULTI-LAYERED METAL LINE OF SEMICONDUCTOR DEVICE FOR PREVENTING DIFFUSION BETWEEN METAL LINES AND METHOD FOR FORMING THE SAME

(75) Inventors: Jeong Tae Kim, Kyoungki-do (KR); Baek Mann Kim, Kyoungki-do (KR); Soo Hyun Kim, Seoul (KR); Young Jin Lee, Kyoungki-do (KR); Dong Ha Jung, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 12/607,267

(22) Filed: Oct. 28, 2009

(65) Prior Publication Data

US 2010/0038788 A1 Feb. 18, 2010

Related U.S. Application Data

(62) Division of application No. 11/755,852, filed on May 31, 2007, now Pat. No. 7,629,248.

(30) Foreign Application Priority Data

Dec. 28, 2006 (KR) ...................... 10-2006-0137203

(51) Int. Cl.
*H01L 23/522* (2006.01)
*H01L 23/528* (2006.01)
*H01L 23/532* (2006.01)

(52) U.S. Cl. ........................ 257/751; 257/758; 257/762; 257/763; 257/764; 257/765; 257/773; 257/E23.16; 257/E23.151

(58) Field of Classification Search ................ 257/751, 257/758, 762, 763, 764, 765, 773, E23.145, 257/E23.151, E23.154, E23.155, E23.157, 257/E23.16
See application file for complete search history.

(56) References Cited

U.S. PATENT DOCUMENTS 5,470,790 A * 11/1995 Myers et al. ................ 438/625
6,040,243 A * 3/2000 Li et al. ...................... 438/687

(Continued)

FOREIGN PATENT DOCUMENTS

JP 2001-23924 * 1/2001

(Continued)

*Primary Examiner*—Mary Wilczewski
(74) *Attorney, Agent, or Firm*—Ladas & Parry LLP

(57) ABSTRACT

A multi-layered metal line of a semiconductor device includes a semiconductor substrate; a lower metal line formed on the semiconductor substrate and recessed on a surface thereof; an insulation layer formed on the semiconductor substrate including the lower metal line and having a damascene pattern for exposing a recessed portion of the lower metal line and for delimiting an upper metal line forming region; a glue layer formed on a surface of the recessed portion of the lower metal line; a first diffusion barrier formed on the glue layer to fill the recessed portion of the lower metal line; a second diffusion barrier formed on the glue layer and the first diffusion barrier; a third diffusion barrier formed on the second diffusion barrier and a surface of the damascene pattern; and an upper metal line formed on the third diffusion barrier to fill the damascene pattern.

11 Claims, 4 Drawing Sheets

U.S. PATENT DOCUMENTS

| | | | |
|---|---|---|---|
| 6,218,283 B1* | 4/2001 | Park et al. | 438/622 |
| 6,376,353 B1* | 4/2002 | Zhou et al. | 438/612 |
| 6,451,177 B1* | 9/2002 | Gopalraja et al. | 204/192.12 |
| 6,475,909 B2* | 11/2002 | Uozumi | 438/678 |
| 6,613,664 B2* | 9/2003 | Barth et al. | 438/629 |
| 6,734,559 B1* | 5/2004 | Yang et al. | 257/751 |
| 7,186,648 B1* | 3/2007 | Rozbicki et al. | 438/687 |
| 7,332,428 B2* | 2/2008 | Beck | 438/637 |
| 7,399,706 B2* | 7/2008 | Omoto et al. | 438/687 |
| 7,400,045 B2* | 7/2008 | Isono | 257/758 |
| 7,470,616 B1* | 12/2008 | Akinmade-Yusuff et al. | 438/637 |
| 7,517,736 B2* | 4/2009 | Mehta et al. | 438/128 |
| 7,585,765 B2* | 9/2009 | Yang et al. | 438/637 |
| 7,629,248 B2* | 12/2009 | Kim et al. | 438/627 |
| 7,638,423 B2* | 12/2009 | Lee et al. | 438/622 |
| 7,777,344 B2* | 8/2010 | Shih et al. | 257/767 |
| 7,781,327 B1* | 8/2010 | Kailasam et al. | 438/622 |
| 7,790,609 B2* | 9/2010 | Hong | 438/645 |
| 2002/0109234 A1* | 8/2002 | Park et al. | 257/767 |
| 2002/0117399 A1* | 8/2002 | Chen et al. | 205/125 |
| 2002/0171147 A1* | 11/2002 | Yew et al. | 257/751 |
| 2002/0186583 A1* | 12/2002 | Tuttle | 365/171 |
| 2003/0001271 A1* | 1/2003 | Uozumi | 257/758 |
| 2003/0111735 A1* | 6/2003 | Lee | 257/774 |
| 2003/0160331 A1* | 8/2003 | Fujisawa | 257/774 |
| 2003/0194872 A1* | 10/2003 | Parikh et al. | 438/694 |
| 2004/0121621 A1* | 6/2004 | Ruelke et al. | 438/786 |
| 2004/0152295 A1* | 8/2004 | Cooney et al. | 438/623 |
| 2004/0251552 A1* | 12/2004 | Takewaki et al. | 257/758 |
| 2005/0001325 A1* | 1/2005 | Andricacos et al. | 257/762 |
| 2005/0064700 A1* | 3/2005 | Uozumi | 438/626 |
| 2005/0070086 A1* | 3/2005 | Isono | 438/618 |
| 2006/0125100 A1* | 6/2006 | Arakawa | 257/758 |
| 2006/0194430 A1* | 8/2006 | Beck | 438/627 |
| 2007/0032062 A1* | 2/2007 | Lee et al. | 438/597 |
| 2007/0126120 A1* | 6/2007 | Tsao et al. | 257/758 |
| 2007/0138532 A1* | 6/2007 | Maekawa et al. | 257/306 |
| 2007/0173061 A1* | 7/2007 | Hong | 438/687 |
| 2008/0012142 A1* | 1/2008 | Mehta et al. | 257/762 |
| 2008/0061438 A1* | 3/2008 | Hong | 257/751 |
| 2008/0265416 A1* | 10/2008 | Lee et al. | 257/751 |
| 2010/0038788 A1* | 2/2010 | Kim et al. | 257/751 |
| 2010/0055897 A1* | 3/2010 | Chou et al. | 438/638 |
| 2010/0081275 A1* | 4/2010 | Ishizaka et al. | 438/653 |
| 2010/0182041 A1* | 7/2010 | Feng et al. | 326/38 |
| 2010/0230815 A1* | 9/2010 | Tsao et al. | 257/751 |

FOREIGN PATENT DOCUMENTS

| | | | |
|---|---|---|---|
| JP | 2002-064138 | * | 2/2002 |
| JP | 2006-287086 | * | 10/2006 |
| KR | 10-2006-0071544 | * | 12/2004 |

\* cited by examiner

MULTI-LAYERED METAL LINE OF SEMICONDUCTOR DEVICE FOR PREVENTING DIFFUSION BETWEEN METAL LINES AND METHOD FOR FORMING THE SAME

CROSS-REFERENCE TO RELATED APPLICATIONS

The present application claims priority to Korean patent application number 10-2006-0137203 filed on Dec. 28, 2006, which is incorporated herein by reference in its entirety.

BACKGROUND OF THE INVENTION

The present invention relates to a multi-layered metal line of a semiconductor device and a method for forming the same, and more particularly to a multi-layered metal line of a semiconductor device which prevents diffusion between upper and lower metal lines brought into contact with each other and a method for forming the same.

Memory cells in a semiconductor memory device operating in a high speed are formed in a stacked structure. Further, the metal line for carrying the electric signals to the respective cells is formed in a multi-layered structure. The multi-layered metal line offers advantageous design flexibility and allows the wiring resistance and current capacity to be set to an acceptable margin.

Al has been a material of choice for a metal line due to its excellent electric conductivity and its relatively easy-to-process characteristics. However, problems appear when Al is applied to form a metal line in a highly integrated semiconductor device due to undesirably increased resistance of the metal line formed with Al. In dealing with this problem caused by the increased wiring resistance due to the high integration of a semiconductor device, Cu instead of Al is currently being adopted as the suitable material for a metal line, as Cu offers relatively lower resistance than Al.

However, using Cu for all multi-layered metal lines is not considered preferable in consideration of the device characteristics and reasonable manufacturing cost. Therefore, recently, a method for forming a multi-layered metal line has been suggested, in which a lower metal line and an upper metal line are formed using Al and Cu, respectively.

Hereafter, a conventional method for forming a multi-layered metal line of a semiconductor device, in which a lower metal line and an upper metal line are respectively formed using Al and Cu, will be described with reference to FIG. 1.

A passivation layer 130 is formed on a semiconductor substrate 100 having a lower Al line 110 and an interlayer dielectric 120 formed thereon, to prevent the lower Al line 110 from being damaged in a subsequent process. A first insulation layer 140 and an etch barrier 150 for preventing the first insulation layer 140 from being etched in a subsequent process for etching a second insulation layer are sequentially formed on the passivation layer 130. A second insulation layer 160 is then formed on the etch barrier 150.

A via hole 171 is defined to expose the lower Al line 110 by etching the second insulation layer 160, the etch barrier 150, the first insulation layer 140, and the passivation layer 130. By additionally etching the second insulation layer 160 over the via hole 171 using the etch barrier 150 as an etch stop layer until the etch barrier 150 is exposed, a trench 172 is formed to delimit (or define) a metal line forming region. In this way, a dual type damascene pattern 170 composed of the via hole 171 and the trench 172 is formed.

A diffusion barrier 180 is formed on the surface of the damascene pattern 170. The diffusion barrier 180 is made of a stack of a Ti layer 181 and a TiN layer 182. A Cu layer is deposited in the damascene pattern 170, which is formed with the diffusion barrier 180. Through this, a via contact 190 for connecting the lower Al line 110 and an upper Cu line is formed in the via hole 171 of the damascene pattern 170, and the upper Cu line 191 is formed in the trench 172 of the damascene pattern 170.

As described above, when forming the multi-layered metal line according to the conventional method of forming the lower metal line of Al and the upper metal line of Cu, the diffusion barrier 180 is necessarily formed between the lower Al line 110 and the upper Cu line 190, 191 in order to prevent diffusion between the lower Al line 110 and the upper Cu line 190, 191.

In general, the stack of the Ti layer 181 and the TiN layer 182 is mainly used as a diffusion barrier in a multi-layered metal line, in which a lower metal line 110 and an upper metal line 190, 191 are formed using Al and Cu respectively.

However, the stack of the Ti layer 181 and the TiN layer 182 of the diffusion barrier 180 does not provide the sufficient thickness to effectively suppress the diffusion between the lower Al line 110 and the upper Cu line which 190, 191 that are brought into contact with each other.

Increasing the thickness of the diffusion barrier 180 formed by the Ti layer 181 and the TiN layer 182 could suppress the diffusion between the lower Al line 110 and the upper Cu line 190, 191 brought into contact with each other. Nevertheless, the increased thickness of the Ti layer 181 and the TiN layer 182 reduces the overall area of the damascene pattern 170 in which the Cu layer 190, 191 is to be filled, and this in turn causes the resistance to increase due to the reduction of the area of the metal line.

Also, when the thickness of the Ti layer 181 and the TiN layer 182 increases, it is difficult to fill the Cu layer in the via hole 171 of the damascene pattern 170 by which a void can be created in the via hole 171, and the presence of voids causes a significant increase in resistance.

Accordingly, it is not practical to adopt the way of increasing the thickness of the diffusion barrier layer 180 (having the Ti layer 181 and the TiN layer 182) to suppress the diffusion between the lower Al line 110 and the upper Cu line 190, 191 brought into contact with each other.

SUMMARY OF THE INVENTION

An embodiment of the present invention is directed to a multi-layered metal line of a semiconductor device which prevents diffusion between upper and lower metal lines brought into contact with each other and a method for forming the same.

In one embodiment, a multi-layered metal line of a semiconductor device comprises a semiconductor substrate; a lower metal line formed on the semiconductor substrate and recessed on a surface thereof; an insulation layer formed on the semiconductor substrate including the lower metal line and having a damascene pattern for exposing a recessed portion of the lower metal line and for delimiting an upper metal line forming region; a glue layer formed on a surface of the recessed portion of the lower metal line; a first diffusion barrier formed on the glue layer to fill the recessed portion of the lower metal line; a second diffusion barrier formed on the glue layer and the first diffusion barrier; a third diffusion barrier formed on the second diffusion barrier and a surface of the damascene pattern; and an upper metal line formed on the third diffusion barrier to fill the damascene pattern.

The lower metal line is made of an Al layer.

The lower metal line is recessed by a thickness corresponding to 1/20~1/2 of an overall thickness of the lower metal line.

The glue layer is made of a Ti layer.

The glue layer has a thickness of 10~200 Å.

The first diffusion barrier is made of a TiN layer.

The second diffusion barrier is made of a TiCN layer.

The second diffusion barrier has a thickness of 5~50 Å.

The third diffusion barrier is made of a Ta or TaN layer.

The third diffusion barrier has a thickness of 10~100 Å.

The upper metal line is made of a Cu layer.

In another embodiment, a method for forming a multi-layered metal line of a semiconductor device comprises the steps of forming an insulation layer on a semiconductor substrate formed with a lower metal line; etching the insulation layer and thereby forming a damascene pattern for exposing the lower metal line and for delimiting an upper metal line forming region; recessing an exposed portion of the lower metal line; forming a glue layer on a surface of the recessed portion of the lower metal line; forming a first diffusion barrier on the glue layer to fill the recessed portion of the lower metal line; forming a second diffusion barrier on the first diffusion barrier and the glue layer; forming a third diffusion barrier on the second diffusion barrier and on a surface of the damascene pattern; and forming an upper metal line on the third diffusion barrier to fill the damascene pattern.

The lower metal line is made of an Al layer.

The step of etching the lower metal line is implemented in a manner such that the lower metal line is etched by a thickness corresponding to 1/20~1/2 of an overall thickness of the lower metal line.

The glue layer is made of a Ti layer through CVD or PVD.

The glue layer is formed to have a thickness of 10~200 Å.

The first diffusion barrier is made of a TiN layer through CVD.

The second diffusion barrier is made of a TiCN layer.

The second diffusion barrier is formed to have a thickness of 5~50 Å.

The second diffusion barrier is formed through heat treatment or plasma treatment of the first diffusion barrier and the glue layer using a hydrocarbon-based source gas.

The hydrocarbon-based gas is $CH_3$ or $C_2H_5$ gas.

The plasma treatment is implemented under an atmosphere of $CH_3$ or $C_2H_5$ at conditions including a temperature of 200~500° C., a pressure of 1~100 torr and an RF power of 0.1~1 kW.

The third diffusion barrier is made of a Ta or TaN layer.

The third diffusion barrier is formed to have a thickness of 10~100 Å.

The upper metal line is made of a Cu layer.

DESCRIPTION OF SPECIFIC EMBODIMENTS

In the present invention, in order to suppress the diffusion between upper and lower metal lines brought into contact with each other, a diffusion barrier, which is inserted as a contact interface between Al forming the lower metal line and Cu forming the upper metal line, is made of a stack of a TiN layer, a TiCN layer, and a Ta or TaN layer.

Since the TiCN layer has excellent diffusion prevention characteristics, the diffusion barrier made of the stack of the TiN layer, the TiCN layer, and the Ta or TaN layer retains excellent capability for preventing diffusion between the lower Al line and the upper Cu line brought into contact with each other.

Accordingly, when forming a multi-layered metal line by using Al for the lower metal line and Cu for the upper metal line in a ultra-high-integrated semiconductor device, the present invention makes it possible to form an excellent diffusion barrier for suppressing diffusion between the lower Al line and the upper Cu line brought into contact with each other. As a result, it is possible to prevent a metallic compound of high resistance from being formed due to diffusion between the upper and lower metal lines.

Therefore, since the present invention makes it possible to prevent a metallic compound of high resistance from being formed due to diffusion between the upper and lower metal lines brought into contact with each other, the performance characteristics of a semiconductor device are improved.

Hereafter, a method for forming a multi-layered metal line of a semiconductor device in accordance with an embodiment of the present invention will be described in detail with reference to FIGS. 2A through 2E.

Figure 1:
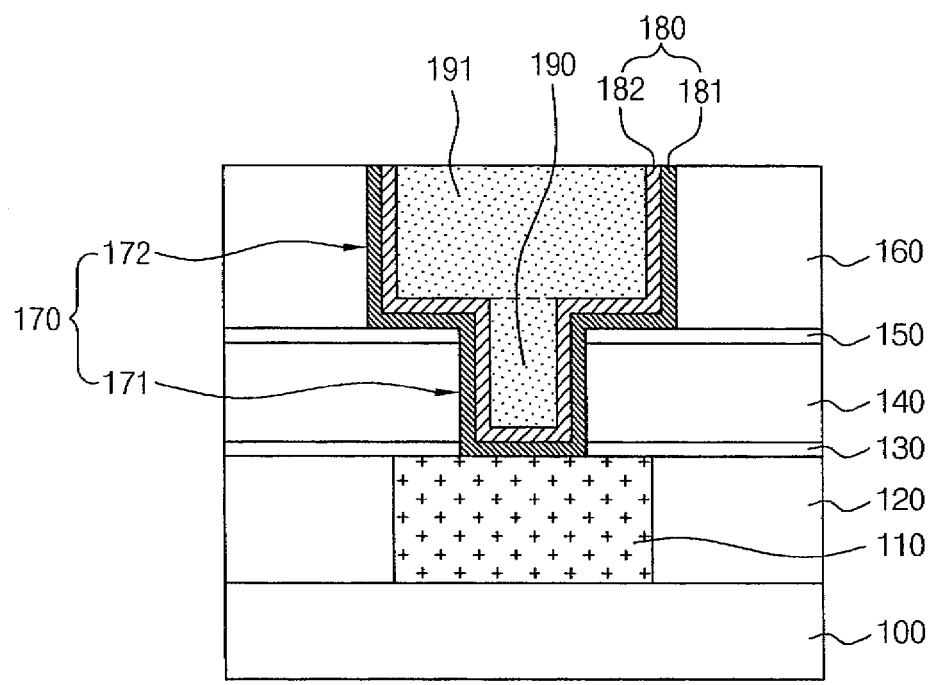
FIG. 1 is a cross-sectional view showing a conventional multi-layered metal line in a semiconductor device.
Figure 2A:
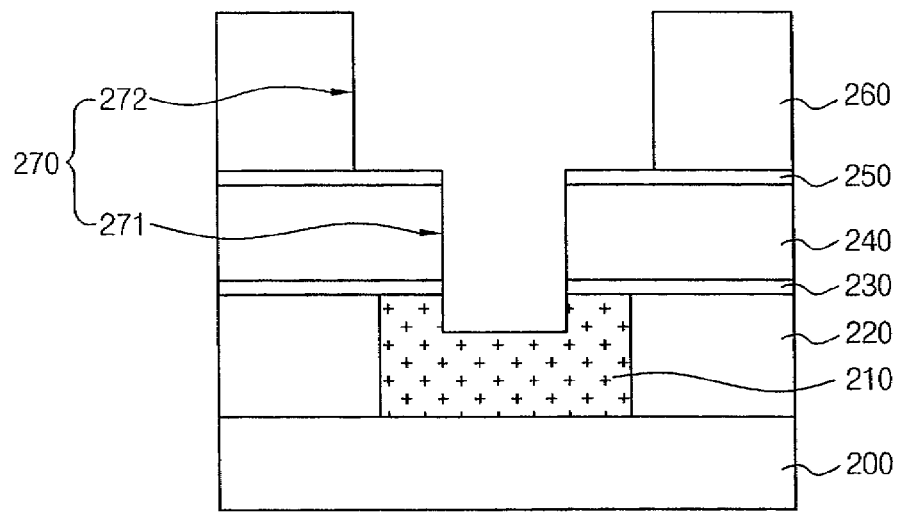
FIGS. 2A through 2E are cross-sectional views showing the steps of forming a multi-layered metal line in a semiconductor device in accordance with an embodiment of the present invention.

Referring to FIG. 2A, an interlayer dielectric 220 is formed on a semiconductor substrate 200 with a lower Al line 210 formed thereon. A passivation layer 230 is formed on the interlayer dielectric 220 to prevent the lower Al line 210 from being damaged in a subsequent etching process. A first insulation layer 240, an etch barrier 250, and a second insulation layer 260 are formed on the passivation layer 230. Each of the first and second insulation layers 240 and 260 is made of an oxide-based layer, and the etch barrier 250 is made of a nitride-based layer.

By etching the second insulation layer 260, the etch barrier 250, the first insulation layer 240, and the passivation layer 230, a via hole 271 is defined to expose the lower Al line 210. By additionally etching the second insulation layer 260 over the via hole 271 using the etch barrier 250 as an etch stop layer until the etch barrier 250 is exposed, a trench 272 is formed to delimit (or define) an upper metal line forming region. In this way, a dual type damascene pattern 270 composed of the via hole 271 and the trench 272 is formed. Here, while the dual type damascene pattern 270 is formed by defining the trench 272 after defining the via hole 271, the sequence of forming the dual type damascene pattern 270 can be reversed.

Figure 2B:
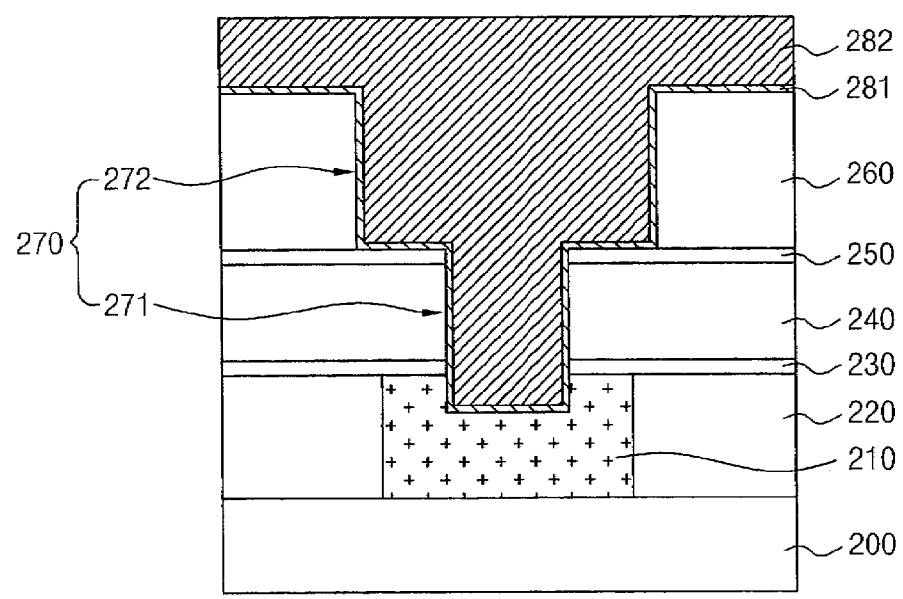

Referring to FIG. 2B, the exposed portion of the lower Al line 210 is recessed. Recessing of the lower Al line 210 is implemented in a manner such that the lower Al line 210 is etched by a thickness corresponding to 1/20~1/2 of the overall thickness of the lower Al line 210.

A glue layer 281 is formed on the surfaces of the via hole 271 and the trench 272 including the recessed portion of the lower Al line 210. The glue layer 281 is made of a Ti layer through a chemical vapor deposition (CVD) process or a physical vapor deposition (PVD) process to a thickness of 10~200 Å.

A first diffusion barrier 282 is formed on the glue layer 281 to fill the damascene pattern 270. The first diffusion barrier 282 is made of a TiN layer through CVD.

Figure 2C:
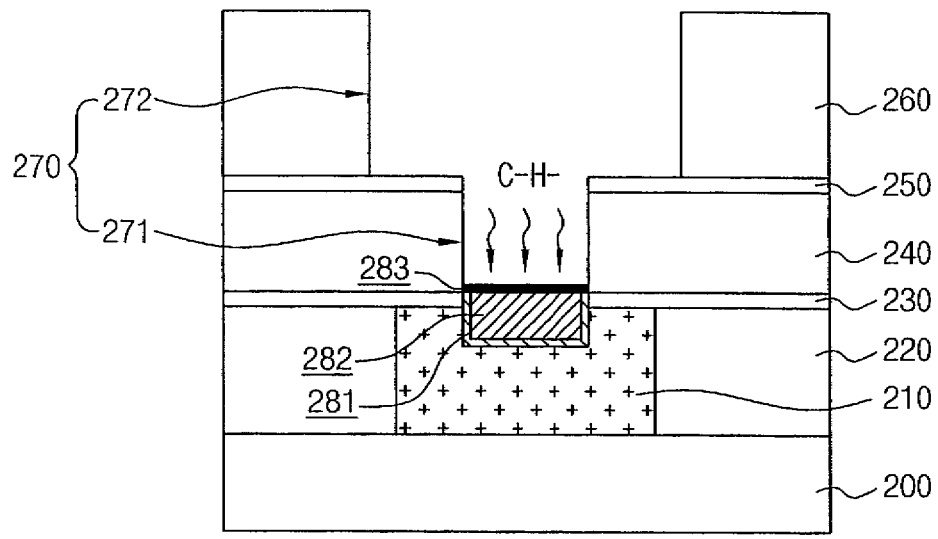

Referring to FIG. 2C, the first diffusion barrier 282 and the glue layer 281 are removed such that the first diffusion barrier 282 and the glue layer 281 remain only on the recessed portion of the lower Al line 210. A second diffusion barrier 283 is formed on the first diffusion barrier 282 and the glue layer 281. The second diffusion barrier 283 is made of a TiCN layer through heat treatment or plasma treatment of the TiN layer 282 serving as the first diffusion barrier and the Ti layer 281 serving as the glue layer using a hydrocarbon-based gas, to have a thickness of 5~50 Å.

The hydrocarbon-based gas includes $CH_3$ or $C_2H_5$ gas. When the TiN layer 282 serving as the first diffusion barrier and the Ti layer 281 serving as the glue layer are plasma-processed, the plasma treatment is conducted under an atmosphere of $CH_3$ or $C_2H_5$ at conditions including a temperature of 200~500° C., a pressure of 1~100 torr and an RF power of 0.1~1 kW.

Figure 2D:
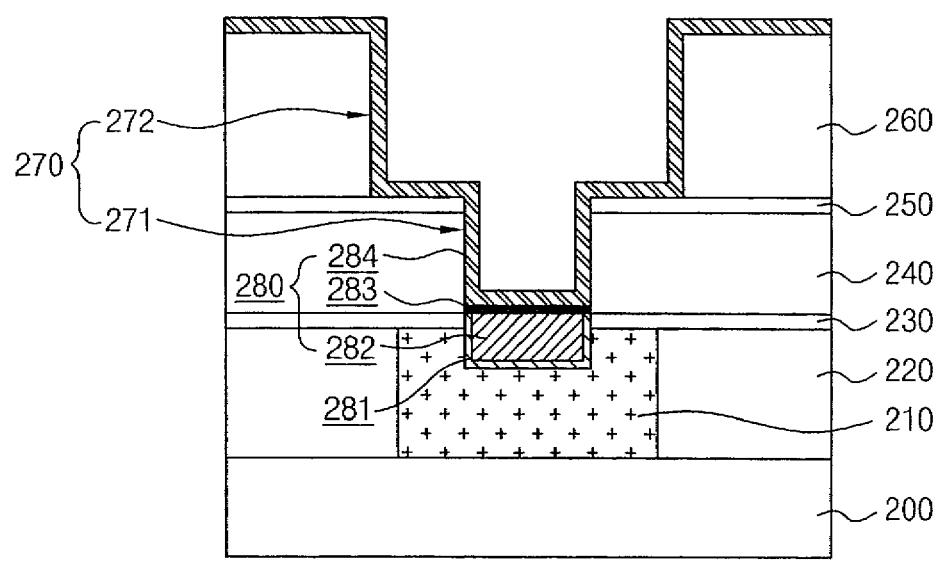

Referring to FIG. 2D, a third diffusion barrier 284 is formed on the TiCN layer 283 serving as the second diffusion barrier and on the damascene pattern 270 to have a thickness of 10~100 Å. Here, the third diffusion barrier 284 is made of a Ta or TaN layer.

Figure 2E:
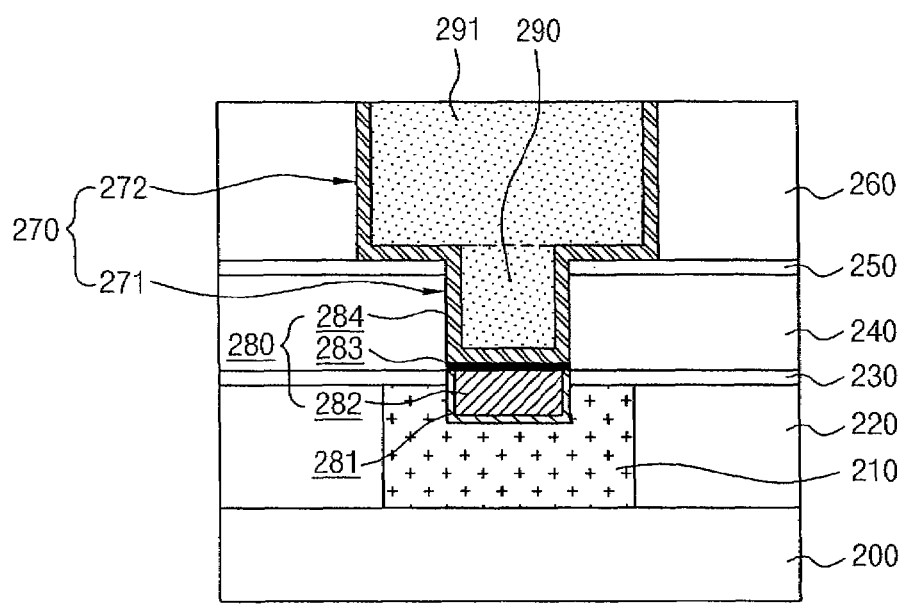

Referring to FIG. 2E, a Cu layer for an upper metal line is deposited on the third diffusion barrier 284 to fill the damascene pattern 270. By etching the Cu layer until the second insulation layer 260 is exposed, a via contact 290 is formed in the via hole 271 of the damascene pattern 270, and an upper Cu line 291 (which along with 290 is brought into contact with the lower Al line 210) is formed in the trench 272 of the damascene pattern 270.

As described above, because the TiCN layer 283 of the present invention having excellent diffusion prevention characteristics is formed through surface treatment of the Ti layer 281 serving as the glue layer and the TiN layer 282 serving as the first diffusion barrier, the diffusion barrier characteristics is improved in the present invention.

Since the TiCN layer 283 has excellent diffusion prevention characteristics, it is possible to form an excellent diffusion barrier capable of suppressing diffusion between the lower Al line 210 and the upper Cu line 290, 291 brought into contact with each other by forming the diffusion barrier which is composed of the TiN layer 282 serving as the first diffusion barrier, the TiCN layer 283 serving as the second diffusion barrier, and the Ta or TaN layer 284 serving as the third diffusion barrier.

As is apparent from the above description, by forming a multi-layered metal line in a semiconductor device by using Al for a lower metal line and Cu for an upper metal line, the present invention makes it possible to form an excellent diffusion barrier for suppressing diffusion between the lower Al line and the upper Cu line brought into contact with each other. As a result, it is possible to prevent a metallic compound of high resistance from being formed due to diffusion between the metal lines.

Therefore, when forming a multi-layered metal line composed of the lower Al line and the upper Cu line, the characteristics of a semiconductor device of the present invention are improved since a metallic compound of high resistance due to diffusion between the upper and lower metal lines brought into contact with each other is prevented from being formed.

Although a specific embodiment of the present invention has been described for illustrative purposes, those skilled in the art will appreciate that various modifications, additions and substitutions are possible, without departing from the scope and the spirit of the invention as disclosed in the accompanying claims.

What is claimed is:

1. A multi-layered metal line of a semiconductor device, comprising:
   a semiconductor substrate;
   a lower metal line formed on the semiconductor substrate, wherein a portion of the surface of the lower metal line is recessed below the surface of the remaining portion of the lower metal line;
   an insulation layer formed on the semiconductor substrate including the lower metal line, wherein the insulation layer has a damascene pattern exposing the recessed portion of the lower metal liner and by which an upper metal line forming region is defined;
   a glue layer formed on a surface of the recessed portion of the lower metal line;
   a first diffusion barrier formed on the glue layer to fill the recessed portion of the lower metal line;
   a second diffusion barrier formed on the glue layer and the first diffusion barrier;
   a third diffusion barrier formed on the second diffusion barrier and a surface of the damascene pattern; and
   an upper metal line formed on the third diffusion barrier to fill the damascene pattern.

2. The multi-layered metal line according to claim 1, wherein the lower metal line is made of an Al layer.

3. The multi-layered metal line according to claim 1, wherein the portion of the lower metal line is recessed by a thickness corresponding to $\frac{1}{20}$~$\frac{1}{2}$ of an overall thickness of the lower metal line.

4. The multi-layered metal line according to claim 1, wherein the glue layer is made of a Ti layer.

5. The multi-layered metal line according to claim 1, wherein the glue layer has a thickness of 10~200 Å.

6. The multi-layered metal line according to claim 1, wherein the first diffusion barrier is made of a TiN layer.

7. The multi-layered metal line according to claim 1, wherein the second diffusion barrier is made of a TiCN layer.

8. The multi-layered metal line according to claim 1, wherein the second diffusion barrier has a thickness of 5~50 Å.

9. The multi-layered metal line according to claim 1, wherein the third diffusion barrier is made of a Ta or TaN layer.

10. The multi-layered metal line according to claim 1, wherein the third diffusion barrier has a thickness of 10~100 Å.

11. The multi-layered metal line according to claim 1, wherein the upper metal line is made of a Cu layer.

* * * * *